United States Patent

Hatakeyama et al.

[11] Patent Number: 4,663,192
[45] Date of Patent: May 5, 1987

[54] PRODUCTION OF TRANSPARENT ELECTRODE SUBSTRATE

[75] Inventors: Hiroshi Hatakeyama, Ootsu; Masayuki Ogawa, Kusatsu; Kozo Matsumura; Eiji Nakagawa, both of Kyoto, all of Japan

[73] Assignee: Nissha Printing Co., Ltd., Japan

[21] Appl. No.: 778,361

[22] PCT Filed: Jan. 18, 1985

[86] PCT No.: PCT/JP85/00018
§ 371 Date: Oct. 22, 1985
§ 102(e) Date: Oct. 22, 1985

[87] PCT Pub. No.: WO85/03378
PCT Pub. Date: Aug. 1, 1985

[30] Foreign Application Priority Data
Jan. 18, 1984 [JP] Japan .................. 59-7576

[51] Int. Cl.$^4$ ............................... B05D 5/12
[52] U.S. Cl. .......................... 427/108; 427/58; 427/266; 427/96; 427/259
[58] Field of Search .......... 427/264, 265, 266, 58, 427/259, 96, 108, 412.5

[56] References Cited
U.S. PATENT DOCUMENTS
3,985,597 10/1976 Zielinski .................. 427/264
4,242,438 12/1980 Sato ........................ 430/278
4,252,841 2/1981 Kinuzawa ................. 427/108
4,326,929 4/1982 Minezaki ................. 427/108

FOREIGN PATENT DOCUMENTS
5/-56966 5/1976 Japan.
5/-143892 12/1976 Japan.

Primary Examiner—John D. Smith
Assistant Examiner—Vi Duong Dang
Attorney, Agent, or Firm—Robbins & Laramie

[57] ABSTRACT

A process for preparing a transparent electrode substrate comprising forming, on an insulated transparent substrate film (A), a polymer compound layer (B) formed from at least one class consisting of polyurethane resin, a polyester resin and an epoxy resin, forming partly thereon a water-soluble coating layer (C), further forming conductive layer (D) having a surface electric resistance of 10 to $10^4$ ohm/□, and dissolving and removing the water-soluble coating layer (C) and the transparent conductive layer (D) thereon by the aid of washing.

2 Claims, 7 Drawing Figures

PRODUCTION OF TRANSPARENT ELECTRODE SUBSTRATE

DESCRIPTION

FIELD OF THE INVENTION

The present invention relates to a process for preparing a flexible transparent electrode substrate. The object of the present invention is to provide a process for easily and economically preparing a flexible transparent electrode substrate having good properties in surface strength, abrasion resistance, surface resistance and the like.

BACKGROUND OF THE INVENTION

There has been proposed the use of a flexible transparent electrode substrate for electrodes of a liquid crystal display, an electroluminescence display, an electrophotographic recording medium, an electrophoretic recording medium, an electron beam recording medium, a transparent switch, a connector and the like.

The following process have been utilized for the production of such a flexible transparent electrode substrate: A thin film of a metal, such as gold, silver, palladium and the like; or a metal oxide, such as stannum oxide, indium oxide, antimony oxide, cadmium stannum oxide and the like is formed on plastic transparent film by way of a vacuum evaporation process, a sputtering process and a masking layer by a resist ink or a photoresist is formed thereon in the part of desirable electrode pattern. Then, the unnecessary part of the metal thin film or metal oxide thin film is removed by way of a wet or dry etching process, followed by removing the masking layer to obtain a flexible transparent electrode substrate.

However, the transparent electrode substrate obtained by the above process has the following defects.

(1) The abrasion resistance of the substrate is not sufficient, since the metal thin film or metal oxide thin film is weak in surface strength and also a part without forming the metal thin film or metal oxide thin film i.e. a part which the transparent plastic film is exposed is weak in surface strength.

(2) The substrate lacks stability, since the metal thin film or metal oxide thin film is not adhered tightly to the transparent plastic film because the thin film is directly adhered to the transparent plastic film.

Furthermore, the above process also have the following defects because of the etching process mentioned above. Thus;

(3) Productivity is not good, since it takes quite long time for the drying process when the masking layer is made by a resist ink.

(4) Productivity also is not good, since many steps such as application of photosensitive resin, print and develop of pattern, removal of photoresist and the like is required for making the masking layer by a photoresist.

(5) The electric resistance of the electrode pattern becomes increased or the snapping of the pattern occurs often, since the pattern becomes thin by means of a side-etching when the etching is carried out.

(6) For solving the problem (5), the etching width must be formed when the masking layer is made. It is difficult to control technically the etching width.

(7) The snapping of the electrode pattern easily occurs, since the metal thin film or metal oxide thin film has a stain or damage on the surface when the masking layer is removed.

(8) The cost of the above process is expensive, since the resist ink or photoresist is expensive.

(9) Environmental pollution problems would be associated with a corrosive liquid.

Because of the above problems, especially problems (1) and (2), the transparent electrode substrate obtained by the above process can only be used for a limited field or it requires a further treatment, for example by coating it with a protective film in practice. For dissolving the above problems, Japanese patent publication (unexamined) No. 10450/1981 discloses a process in which a hard organic treating layer obtained from a silicon resin, an acrylate resin formed from a compound having acryloyl groups, a vinyl polymer formed from a compound having vinyl groups, etc. is placed between the metal thin film or metal oxide thin film and the transparent plastic film. However, even in this process, it has possibility that the treating layer is affected by an alkali solution or an organic solution used in an etching process. As the result, a material used for the treating layer must be limited to one which is not affected by the alkali solution or the organic solution. Accordingly, there has not been substantially solved the above problems, especially there have been remained the problems associated with the etching process.

DESCRIPTION OF THE INVENTION

As the result of the intensive study for dissolving the above problems in the prior art by the inventors of the present invention, it has been found that, instead of the above etching process in the prior art, a process, in which a coating layer comprising a water-soluble material is formed on a part which the transparent conductive layer is not needed and the coating layer is removed at a later stage by washing together with the transparent conductive layer formed on the water-soluble layer and further a particular polymer compound layer is allowed to place between the insulated transparent substrate film and the water-soluble layer, is adopted as a mean for forming the transparent conductive layer having a desirable pattern on an insulated transparent substrate film, whereby all of the above problems are entirely obviated. In the light of the above knowledges, as the result of the study for selecting suitable materials for forming the polymer compound, water-soluble material or transparent conductive layer, the present invention has been accomplished. Thus, the present invention provide a process for preparing a transparent electrode substrate, comprising:

forming, on an insulated transparent substrate film (A), a polymer compound layer (B) formed from at least one class consisting of a polyurethane resin, a polyester resin and an epoxy resin, forming partly thereon a water-soluble coating layer (C), further forming thereon a transparent conductive layer (D) having a surface electric resistance of 10 to $10^4$ ohm/□, and dissolving and removing the water-soluble coating layer (C) and the transparent conductive layer (D) thereon by the aid of washing.

BRIEF EXPLANATION OF THE DRAWINGS

Illustrating the invention are the following drawings.

FIG. 2-b, FIG. 3-b and FIG. 4-b show sectional views of another embodiment of the present invention.

PREFERRED EMBODIMENT FOR PRACTICING THE PRESENT INVENTION

Figure 1:
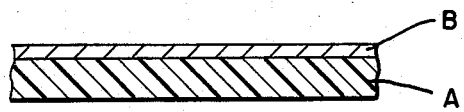
FIG. 1, FIG. 2-a, FIG. 3-a and FIG. 4-a show sectional views of the process of the present invention.

First, the polymer compound layer (B) is formed on the insulated transparent substrate film (A) (see FIG. 1).

The insulated transparent substrate film (A) used in the present invention includes a wide variety of plastic films, for example polyesters such as polyethylene terephthalate; polycarbonates; polyvinylchlorides; polyethylenes; polypropylenes; polyamides; cellulose acetates; and the like. Preferred is a polyester film, because the polyester film has excellent characteristics in transparency, dimension stability, evenness of thickness, strength, heat resistance, chemical resistance, water-resistance and the like. The polyester film used in the present invention is generally oriented biaxially to improve mechanical properties. Preferably the insulated transparent substrate film (A) has 12 to 250 μm in thickness from the point of functional view as a transparent electrode.

The polymer compound layer (B) which is formed on the insulated transparent substrate film (A) includes those having the following properties i.e. (1) good transparency, (2) good water-resistance, (3) good releasability to the water-soluble coating layer (C) during the washing period, (4) good adhesion to the transparent conductive layer (D), (5) improvability of surface strength of the transparent conductive layer (D) and the insulated transparent substrate film (A) and the like. Examples of the polymer compound (B) are (1) polyurethanes, such as a polymer of a polyester polyol with an isocyanate compound, a polymer of a polyether polyol with an isocyanate compound, a polymer of a castor oil type polyol with an isocyanate compound. Representative examples are polymers obtained from a reaction of a polyester polyol formed by reacting an organic acid such as phthalic acid, adipic acid, maleic acid and the like with a glycol such as ethylene glycol, propylene glycol, butylene glycol, glycerol, trimethylolethan, pentaerythritol and the like, with tolylene diisocyanate. It is impossible to measure molecular weights of these polyurethanes, because they are generally cross-linked three-dimensionally.

(2) polyesters, such as a condensation polymer of a dicarboxylic acid such as fumaric acid, phthalic anhydride, maleic acid, terephthalic acid, succinic acid, adipic acid, sebacic acid and the like, with a glycol such as ethylene glycol, propylene glycol, 1,4-butane diol, diethylene glycol, triethylene glycol, glycerol. The polyesters have molecular weight of 1,000 to 100,000, preferably 3,000 to 20,000.

(3) epoxy resins, such as those which an epoxy resin obtained by a reaction of bisphenol A with epichlorohydrine is cross-linked with an amine such as ethylene diamine, ethanol amine and the like. The epoxy resin has preferably a molecular weight of 200 to 10,000, preferably 300 to 2,000.

The polymer compound layer (B) has a thickness of 0.01 to 10 μm, especially 0.1 to 1 μm in thickness.

The polymer compound layer (B) can be formed on the both sides of the insulated transparent substrate film, thus the polymer compound layer (B) fills the role of surface protection of the insulated transparent substrate film (A).

Figure 2A:
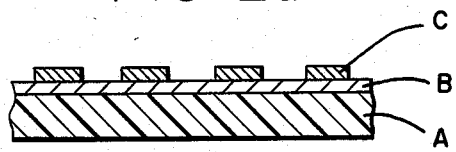
Figure 2B:
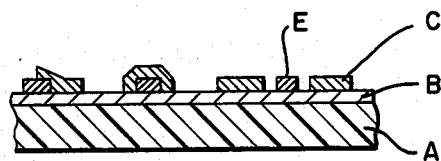

Then, the water-soluble coating layer (C) is formed on the polymer compound layer (B) (see FIG. 2-a).

This water-soluble layer (C) is partially formed on a part which the transparent conductive layer (D) is not necessary. This water-soluble layer (C) partially formed will correspond the negative part of the transparent electrode pattern. When a symbol or marking is formed for checking in the transparent conductive layer (D), the modification of water-soluble coating layer (C) can be done according to their checking embodiment. The water-soluble material used for forming the water-soluble coating layer (C) includes vinyl type water-soluble resins, such as polyvinyl alcohol, polyvinyl pyrolidone and the like; cellulose ether type resins such as methyl cellulose, carboxymethyl cellulose, hydroxyethyl cellulose, hydroxypropyl cellulose and the like; acrylic acid type water-soluble materials such as sodium acrylate, ammonium acrylate and the like; natural water-soluble materials such as starch, dextrin, glue, gelatin and the like; protein type water-soluble materials, such as casein, sodium caseinate, ammonium caseinate and the like; polyethyleneoxide; Carrageenan; glucomannan; and the like. At least one of the above water-soluble materials is dissolved in an aqueous solution to form an ink-like solution to be used. More preferred in the above water-soluble materials is a mixture of polyvinyl alcohol as main component with another water-soluble material. The coating process for the water-soluble coating layer (C) includes a screen printing when the thick layer is desired; a planography printing, a chalcograph printing, a flexso printing when the thin layer is desired. The printing process may be selected accoding to desired thickness of the water-soluble coating layer. In case where an out-gas problem is taken into consideration, most preferred process is the chalcograph printing in which a solvent can be remained very little after printing. When a rotary press is employed for the coating process, the rolling can be conducted continuously and a transparent electrode having a continuous pattern can be easily formed. From the point of this view, the chalcography printing is very suitable. The water-soluble coating layer (C) has a thickness of 0.1 to 10 μm, preferably 0.5 to 5 μm.

Figure 3A:
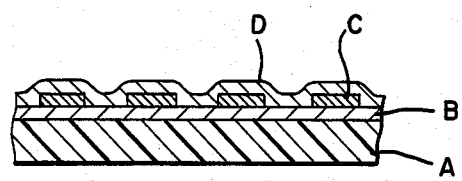
Figure 3B:
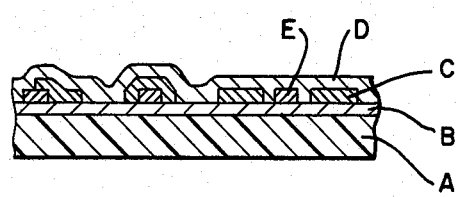

Next, the transparent coductive layer (D) is formed on the polymer compound material (B) as covering the water-soluble coating layer (C) (see FIG. 3-a).

The transparent conductive layer (D) can be those having both conductivity and transparency when the thin film is formed, for example, metal such as gold, silver, platinum, palladium, rhodium, and the like; and metal oxide such as stannum oxide, indium oxide, antimony oxide, titanium oxide, zirconium oxide, indium oxide-stannum oxide, stannum oxide-antimony oxide, and the like. Preferably, indium oxide-stannum oxide or gold layer is formed by way of a vacuum evaporation, a sputtering, an ion-plating process and the like.

This transparent conductive layer (D) can be formed as either single layer or plural layers. The transparent conductive layer (D) is 10 to 500 Å in thickness and 10 to $10^4$ ohm/□, preferably 100 to 2,000 ohm/□ in surface electric resistance. It also is 50 to 90%, preferably 80 to 90% in parallel light transmittance measured by parallel light at 550 nm.

Figure 4A:
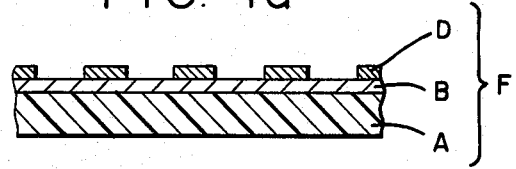
Figure 4B:
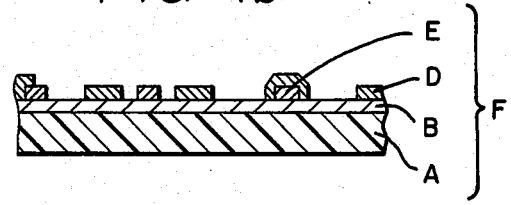

Next step is to wash a sheet shown in FIG. 3-a, in which the transparent conductive layer (D) has been formed by way of the above process (see FIG. 4-a).

The washing process includes a shower washing using cool water or warm water, an immersion in a water bath, an ultrasonic washing, a microwave washing and the like. The use both of the imersion in the water bath and the shower washing is preferred in a continuous producing process. The shower washing may be preferably conducted under a pressure of one to 3 Kg/cm$^2$ at a flow rate of 3 to 20 l/min. Besides the above process, a process in which the sheet passes through between sponge rollers with providing water. The sponge roller is preferably soft, which is prepared from polyvinyl alcohol.

In the washing process, it is noted that the water-soluble coating layer (C) which prevents the transparency of the transparent electrode substrate is completely removed and also the surface of the transparent conductive layer (D) is not damaged. In the present invention, the combination of the polymer compound layer (B) with the water-soluble coating layer (C) provides that the water-soluble coating layer (C) is dissolved and completely removed from the polymer compound layer (B) together with the unnecessary transparent conductive layer (D) placed on the water-soluble coating layer (C).

From the above process, the transparent electrode substrate (F) which has formed the transparent electrode having a desirable pattern on the particular parts can be obtained.

In the present invention, a printing layer (E) constituting patterns, such as a letter, a symbol and the like may be formed before and/or after forming the polymer compound layer (B). (see FIG. 2-b, 3-B and 4-B). The printing layer (E) can be formed on the opposite side of the insulated transparent substrate film (A), i.e. the opposite of the surface forming the polymer compound layer (B) and also can be formed on the transparent electrode. The printing layer (E) will be a display on the transparent electrode substrate (F).

It is an excellent technical effect from the present invention that the printing layer (E) can be formed on or/and under the polymer compound layer (B), in other word, the printing layer (E) can be formed between the insulated transparent substrate film (A) and the transparent conductive layer (D). In a conventional etching process, the printing layer before forming the transparent conductive layer must precisely coincide with the masking layer after forming the transparent conductive layer. This process is very difficult to carry out, because both processes forming the printing layer and the masking layer are difference from each other. In the present invention, the printing layer (E) is easily formed to coincide with the water-soluble coating layer (C) by the aid of multi-color printing machine.

Characteristic values of the present invention are mesured as follow:
(1) Surface electric resistance
measured by a digital tester (available from Iwasaki Tsushinki Co. Ltd. as VOAC 707). Thirty five mm width sample is placed on a rubber sheet having the rubber hardness of about 60 with its treating surface facing above, on which an electrode having 35 mm width and 35 mm facing distance is further placed to measure the resistance between electrode ends.
(2) Parallel light transmittence
measured at wave length $\lambda = 550$ nm (using filter) by the aid of Heize Meter (available from Nippon Seimitsu Kogaku Co. Ltd. as SEP-H-S)
(3) Intermittent life test of transparent electrode substrate
Two piece of samples having cut in 40×40 mm are protected by an electroconductive paint in the fringe area of the treating surface, to which a lead wire for mesurement is connected. The transparent conductive layer surfaces are faced and sticked with each other through a vinyl chloride spacer having 40 mm long×40 mm wide×0.1 mm thickness in which the center part having 20×20 mm is cut off to form a test piece. The piece is placed on an acryl resin plate and 5 volt is applied. With keeping this condition, a steel rod having 5 mm diameter and 2 mmR at its end point is inserted by reciprocating motion at the rate of 140 times/min under the pressure of 200 g until the surface electric resistance of the sample becomes 10 times larger than the original value. The repeating times is considered as the intermittent life time.

Illustrating the invention is the following example.

<EXAMPLE 1>

A polyurethane resin comprising as a main component a polymer obtained from a reaction of tolylenediisocyanate with a polyester polyol formed from reacting maleic acid and pentaerithritol was dissolved with ethyl acetate to form a coating composition having the solid content of 1%. The coating composition was applied to a diaxially oriented polyethylene terephthalate film (thickness: 0.1 mm, parallel light transmittence at 550 nm: 87%) in the amount of about 10 g/m$^2$ and dried and cured for 5 minutes at 140° C. to form a polyurethane film having about 0.1 $\mu$m thickness. On this urethane film, an ink comprising the following charge was applied in the amount of about 2 g/m$^2$ and dried and cured for 20 seconds at 150° C. to obtain a water-soluble coating layer having about 2 $\mu$m thickness:

| Ingredient | Parts by weight |
| --- | --- |
| Polyvinyl alcohol | 8 |
| Sodium acrylate | 2 |
| Precipitated barium sulfate | 60 |
| Methanol | 20 |
| Isopropyl alcohol | 10 |

Then, indium.stannum oxide having indium oxide/stannum oxide=90/10 was deposited by way of a sputtering process on the water-soluble coating layer. The spattering process was conducted at the vacuum of 10$^{-3}$ Torr under an argon blanket. The deposited film had about 100 Å thickness. The transparent conductive film had the parallel light transmittence of 86% and the surface electric resistance 10$^3$ ohm/□ and it had excellent transparency.

Then, the transparent conductive film was washed by means of a sponge roller under the condition such as water pressure of 2 kg/m$^2$, water amount of 2 l/min and washing rate of 5 m/min, followed by drying in a hot-air drying chamber.

The resultant transparent electrode substrate was subjected to the transmittence life test. Peeling and cut off was not recognised after 1,000,000 times repeating test and the substrate exhibited excellent properties.

For comparison, a transparent electrode substrate was made as described generally in the above process with the exception that a polyurethane compound layer was not formed. The resultant transparent electrode substrate was observed peeling after 5,000 times repeating test, and therefore it had not serviceability.

The transparent electrode substrate of the present invention which comprises the above constitution exhibits the following technical effect. The present invention not only dissolves the several defects presented in the prior etching process, but also it provides the transparent electrode substrate having excellent surface strength, abrasion resistance, surface resistance and the like because of allowing the polymer compound layer to place between the substrate film and the transparent conductive film. A water-soluble coating layer which is placed on a polymer compound layer having good release property provides the excellent stability of resistance. Accordingly, the present invention provides easily and economically a transparent electrode substrate having good functions as an electrode.

Utility in the field

As is mentioned before, the transparent electrode substrate of the present invention can be used as a flexible transparent electrode for a liquid crystal display, an electroluminescence display, an electrophotographic recording medium, an electrophoretic recording medium, an electron beam recording medium, a transparent switch, a connector and the like. The present invention has high utility value in this field.

We claim:

1. A process for preparing a transparent electrode substrate comprising:
   forming on an insulated transparent substrate film (A) a polymer layer (B), said polymer layer (B) formed from at least one class consisting of a polyurethane resin, a polyester resin and an epoxy resin,
   forming a water-soluble coating layer (C) on a part of said polymer layer (B), said polymer layer (C) comprising an organic material having a hydroxyl group, an ether group, a carboxyl group or an amino group,
   forming a transparent conductive layer (D) having a surface electric resistance of 10 to $10^4$ ohm/□ on said polymer layer (B) and said coating layer (C), and
   dissolving and removing the water-soluble coating layer (C) and the transparent conductive layer (D) formed on said coating layer (C) by the aid of washing.

2. The process of claim 1 wherein a printing layer (E) which constitutes a pattern such as a letter, a symbol and the like is formed before and/or after the polymer compound layer (B) is formed on the insulated transparent substrate film (A).

* * * * *